United States Patent
Yue et al.

(10) Patent No.: US 10,962,567 B2
(45) Date of Patent: Mar. 30, 2021

(54) SYSTEMS AND METHODS FOR ELECTRICAL INSPECTION OF FLAT PANEL DISPLAYS USING CELL CONTACT PROBING PADS

(71) Applicant: Photon Dynamics, Inc., San Jose, CA (US)

(72) Inventors: Gordon Yue, Sunnyvale, CA (US); Lloyd Russell Jones, Los Gatos, CA (US); Neil Dang Nguyen, Milpitas, CA (US); Kiran Jitendra, San Jose, CA (US); Kent Nguyen, San Jose, CA (US); Steven Aochi, Morgan Hill, CA (US)

(73) Assignee: Photon Dynamics, Inc.

( * ) Notice: Subject to any disclaimer, the term of this patent is extended or adjusted under 35 U.S.C. 154(b) by 697 days.

(21) Appl. No.: 15/359,578

(22) Filed: Nov. 22, 2016

(65) Prior Publication Data
US 2017/0146567 A1    May 25, 2017

Related U.S. Application Data

(60) Provisional application No. 62/259,075, filed on Nov. 24, 2015.

(51) Int. Cl.
*G01R 1/073*    (2006.01)
*G01R 1/067*    (2006.01)
(Continued)

(52) U.S. Cl.
CPC ..... *G01R 1/06794* (2013.01); *G01R 1/06722* (2013.01); *G01R 1/07307* (2013.01);
(Continued)

(58) Field of Classification Search
CPC ............ G01R 1/06794; G01R 1/06722; G01R 1/07307; G01R 1/07364; G02F 1/1309;
(Continued)

(56) References Cited

U.S. PATENT DOCUMENTS 4,471,298 A * 9/1984 Frohlich ............ G01R 31/2805
                                                  324/72.5
4,983,911 A    1/1991 Henley
(Continued)

FOREIGN PATENT DOCUMENTS

JP    2001074778 A    3/2001
JP    2001318116 A    11/2001
(Continued)

OTHER PUBLICATIONS

JPO, Notice of Reasons of Refusal, Japanese Patent Application No. 2016-224617, dated Aug. 4, 2020.

*Primary Examiner* — Melissa J Koval
*Assistant Examiner* — Trung Nguyen
(74) *Attorney, Agent, or Firm* — Hodgson Russ LLP

(57) ABSTRACT

A probe system for facilitating inspection of a device under test comprising a plurality of panels, the probe system incorporating: a configurable universal probe bar comprising a plurality of probe blocks, the plurality of probe blocks comprising a plurality of probe pins positioned to simultaneously electrically engage a plurality of cell contact pads of the plurality of panels of the device under test to deliver a plurality of electrical test signals; and an alignment system configured to achieve an alignment of the plurality of probe pins with the plurality of the cell contact pads of the plurality of panels of the device under test.

22 Claims, 10 Drawing Sheets

(51) Int. Cl.
*G02F 1/13* (2006.01)
*G09G 3/00* (2006.01)
*G02F 1/1345* (2006.01)

(52) U.S. Cl.
CPC ....... *G01R 1/07364* (2013.01); *G02F 1/1309* (2013.01); *G09G 3/006* (2013.01); *G02F 1/13458* (2013.01)

(58) Field of Classification Search
CPC ...... G02F 1/13458; G09G 3/006; G01N 1/00; G01N 15/00; H01J 37/00
USPC .......................... 324/750.23, 425, 437, 445, 324/754.01–754.11, 754.21, 754.24, 324/755.01, 756.03, 600, 690, 696, 715, 324/724
See application file for complete search history.

(56) References Cited

U.S. PATENT DOCUMENTS

| | | |
|---|---|---|
| 5,097,201 A | 3/1992 | Henley |
| 5,124,364 A | 6/1992 | Wolff et al. |
| 5,124,635 A | 6/1992 | Henley |
| 6,373,268 B1* | 4/2002 | Dunlap .............. G01R 31/2851 324/750.22 |
| 9,103,876 B2 | 8/2015 | Nguyen et al. |
| 2005/0253609 A1 | 11/2005 | Huang |
| 2006/0273815 A1* | 12/2006 | Johnston ............ G01R 31/2893 324/750.19 |
| 2013/0273803 A1* | 10/2013 | Mo ....................... G02F 1/1303 445/60 |

FOREIGN PATENT DOCUMENTS

| | | |
|---|---|---|
| JP | 2005300409 A | 10/2005 |
| JP | 2007003517 A | 1/2007 |
| JP | 2007285727 A | 11/2007 |
| JP | 2007316022 A | 12/2007 |
| JP | 2007322428 A | 12/2007 |
| JP | 2008122145 A | 5/2008 |
| JP | 2014106205 A | 6/2014 |
| KR | 20070074179 A | 7/2007 |
| WO | 2007069818 A1 | 6/2007 |

* cited by examiner

SYSTEMS AND METHODS FOR ELECTRICAL INSPECTION OF FLAT PANEL DISPLAYS USING CELL CONTACT PROBING PADS

CROSS-REFERENCE TO RELATED PATENT APPLICATION

This regular U.S. patent application relies upon, and claims the benefit of priority from U.S. provisional patent application No. 62/259,075, entitled "Systems And Methods For Electrical Inspection Of Flat Panel Displays Using Cell Contact Probing Pads," filed on Nov. 24, 2015, which is incorporated by reference herein in its entirety.

BACKGROUND OF THE INVENTION

Field of the Invention

The present invention relates generally to the field of inspection of electronic devices and in particular to inspection of Liquid Crystal (LC) and Organic Light Emitting Diode (OLED) displays, and the mechanical, optical and electronic systems used in this inspection.

Description of the Related Art

Liquid crystal display (LCD) panels incorporate liquid crystals that exhibit electric-field dependent light modulating properties. They are used most frequently to display images and other information in a variety of devices ranging from fax machines, laptop computer screens, to large screen, high-definition TVs. Active matrix LCD panels are complex layered structures consisting of several functional layers: a polarizing film; a TFT glass substrate incorporating thin-film transistors, storage capacitors, pixel electrodes and interconnect wiring a color filter glass substrate incorporating a black matrix and a color filter array and a transparent common electrode; an orientation film made of polyimide; and the actual liquid crystal material incorporating plastic/glass spacers to maintain proper LCD cell thickness.

LCD panels are manufactured under highly controlled conditions in a clean room environment to maximize yield. Nonetheless, many LCDs have to be discarded because of manufacturing flaws.

As stated above, in order to improve production yield of complex electronic devices, such as LCD panels, various inspection stages are performed in order to identify various defects that can occur during various stages of the fabrication process. The aforesaid inspection stages may be performed between the fabrication stages or after the completion of the entire fabrication process. One example of the aforesaid inspection process is the testing of TFT arrays used in LC and OLED displays for electrical defects. Various inspection devices are used to perform the aforesaid testing. Exemplary devices that could be used for this purpose include Array Checker AC6068 commercially available from Orbotech Ltd. of San Jose, Calif., USA. Alternatively, the TFT array testing may be performed using electron-beam inspection systems known to persons of skill in the art and commercially available.

Electrical inspection systems in general require the device under test (DUT) to be driven with electrical signals, or patterns, that facilitate the detection of defects. These signals are conveyed from a pattern generator subsystem to the DUT by means of a structure carrying probe pins that physically touch contact pads located at the periphery of the active area of the DUT. In the case of the electrical inspection of TFT arrays, one or more shorting bars (implemented on the same substrate as the array) are often disposed between the contact pads used for array test and the panel drive lines. These shorting bars are connected to a subset of drive lines (e.g., one shorting bar may be connected to every other gate line), thereby reducing the number of contacts needed, which simplified the probing assembly.

While the use of the shorting bars facilitates probing of panels for array test, they require additional real estate for each panel. In small panel applications (e.g. mobile phone displays and tablets), this loss of real estate has serious implications for glass utilization. Panel losses due to the implementation of shorting bars can be in the range of 15-20%. Such a large reduction in panels per glass has a serious impact on Fab capacity and revenue for the customer. This was not a major issue until recently, because small panels were not tested frequently. However, with the increase in value and size of mobile phone displays, testing of small LCD panels is becoming increasingly desirable to manage production yields.

SUMMARY OF THE INVENTION

The inventive methodology is directed to methods and systems that substantially obviate one or more of the above and other problems associated with conventional techniques for facilitating inspection of electronic devices.

In accordance with one aspect of the embodiments described herein, there is provided a probe system for facilitating inspection of a device under test comprising a plurality of panels, the probe system incorporating: a configurable probe bar comprising a plurality of probe blocks, the plurality of probe blocks comprising a plurality of probe pins positioned to simultaneously electrically engage a plurality of cell contact pads of the plurality of panels of the device under test to deliver a plurality of electrical test signals; and an alignment system configured to achieve an alignment of the plurality of probe pins with the plurality of the cell contact pads of the plurality of panels of the device under test.

In one or more embodiments, the probe bar further comprises a universal mounting rail and wherein the plurality of probe blocks are mounted in predetermined positions on the universal mounting rail.

In one or more embodiments, the plurality of probe blocks is mounted on the universal mounting rail using a plurality of fasteners.

In one or more embodiments, the plurality of probe pins are pogo pins.

In one or more embodiments, the plurality of probe pins are spring-loaded.

In one or more embodiments, the alignment system further comprises a motor for adjusting a lateral (X) direction position of the probe bar.

In one or more embodiments, the alignment system further comprises a rotation system for rotating the device under test.

In one or more embodiments, the alignment system further comprises a rotation system for rotating the probe bar.

In one or more embodiments, the probe bar is configured using a precision tooling plate comprising a plurality of locating pins, wherein the plurality of locating pins engage alignment holes in the plurality of probe blocks.

In one or more embodiments, the locations of the plurality of locating pins of the precision tooling plate correspond to a layout of the cell contact pads of the device under test.

In one or more embodiments, the probe bar is configured manually by loosening fasteners of the plurality of probe blocks, repositioning the plurality of probe blocks such that the plurality of locating pins engage alignment holes in the plurality of probe blocks and tightening the fasteners of the plurality of probe blocks.

In one or more embodiments, the alignment system further comprises an alignment camera configured to detect positions of the probe blocks of the probe bar and wherein the probe bar is configured is configured automatically based on the detected positions of the probe blocks.

In one or more embodiments, the alignment system further comprises a robot for repositioning the probe blocks of the probe bar based on the detected positions of the probe blocks.

In one or more embodiments, the alignment system further comprises a probe bar reconfiguration station for semi-automatically configuring the probe bar by adjusting positions of the plurality of probe blocks on the probe bar to match a layout of the plurality of cell contact pads.

In one or more embodiments, the probe bar comprises an electrical bus for carrying the plurality of electrical test signals from a pattern generator to the plurality of probe pins of the probe blocks of the probe bar.

In one or more embodiments, the electrical bus runs the entire length of the probe bar.

In one or more embodiments, the plurality of panels are arranged on the device under test into a plurality of panel rows and wherein the probe pins of the probe bar are configured to engage cell contact pads of an entire row of panels of the device under test.

In one or more embodiments, the device under test is a glass substrate and wherein the plurality of panels are display panels.

In one or more embodiments, the probe system further comprises a pin viewer camera for acquiring real time images or real time video of at least some of the plurality of probe pins in contact with at least some of the plurality of the cell contact pads and for providing the acquired images or video for viewing by an operator of the probe system.

In accordance with another aspect of the embodiments described herein, there is provided a method for facilitating inspection of a device under test comprising a plurality of panels, the method involving: configuring a universal probe bar by positioning a plurality of probe blocks at predetermined locations along a universal mounting rail, the plurality of probe blocks comprising a plurality of probe pins, wherein the plurality of probe blocks are positioned to have the plurality of probe pins simultaneously electrically engage a plurality of cell contact pads of the plurality of panels of the device under test to deliver a plurality of electrical test signals; and achieving an alignment of the plurality of probe pins with the plurality of the cell contact pads of the plurality of panels of the device under test.

In one or more embodiments, the universal probe bar is configured manually by loosening fasteners of the plurality of probe blocks, repositioning the plurality of probe blocks such that the plurality of locating pins engage alignment holes in the plurality of probe blocks and tightening the fasteners of the plurality of probe blocks.

In accordance with yet another aspect of the embodiments described herein, there is provided a system for inspection of a device under test comprising a plurality of panels, the system incorporating: a configurable probe bar comprising a plurality of probe blocks, the plurality of probe blocks comprising a plurality of probe pins positioned to simultaneously electrically engage a plurality of cell contact pads of the plurality of panels of the device under test to deliver a plurality of electrical test signals; an alignment system configured to achieve an alignment of the plurality of probe pins with the plurality of the cell contact pads of the plurality of panels of the device under test; a test pattern generator for generating test signals, the test signals being applied, through the plurality of probe pins, to the plurality of cell contact pads of the plurality of panels of the device under test; and an inspection system for performing inspection of the plurality of panels of the device under test in response to the applied test signals.

In one or more embodiments, the inspection system is a voltage imaging optical system.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

Currently, small displays are mostly tested using full contact electrical testers. This method requires no additional real estate for shorting bars because each drive line is contacted individually, but suffers from very low throughput. Throughput is limited mainly because the assemblies used to probe the panels (probe cards) have to move from panel to panel. Throughput can be increased by using multiple probe cards at the same time, but is still relatively slow. As a result, the electronic device testing technique using full contact electrical testers is used for sampling, i.e., for process control, and not for yield management. In addition, it should be noted that full contact probing might not always be possible as the line pitch of electronic devices continues to decrease. It is estimated that the lower limit of pixel size that can be inspected by a full contact system, due to very small line pitch, is approximately 17 µm.

Therefore, in accordance with one or more embodiments of the inventive concept, there is provided a probing technique that enables testing of small panels with high throughput methods such as Voltage Imaging or secondary electron measurements, well known to persons of ordinary skill in the art, without requiring the use of the shorting bars and the associated loss of the panel real estate. This technique can enable 100% inspection of small panels resulting in more effective yield management. Exemplary implementations of the aforesaid Voltage Imaging inspection technique is described in U.S. Pat. Nos. 4,983,911, 5,097,201 and 5,124,364, incorporated herein by reference.

Figure 1:
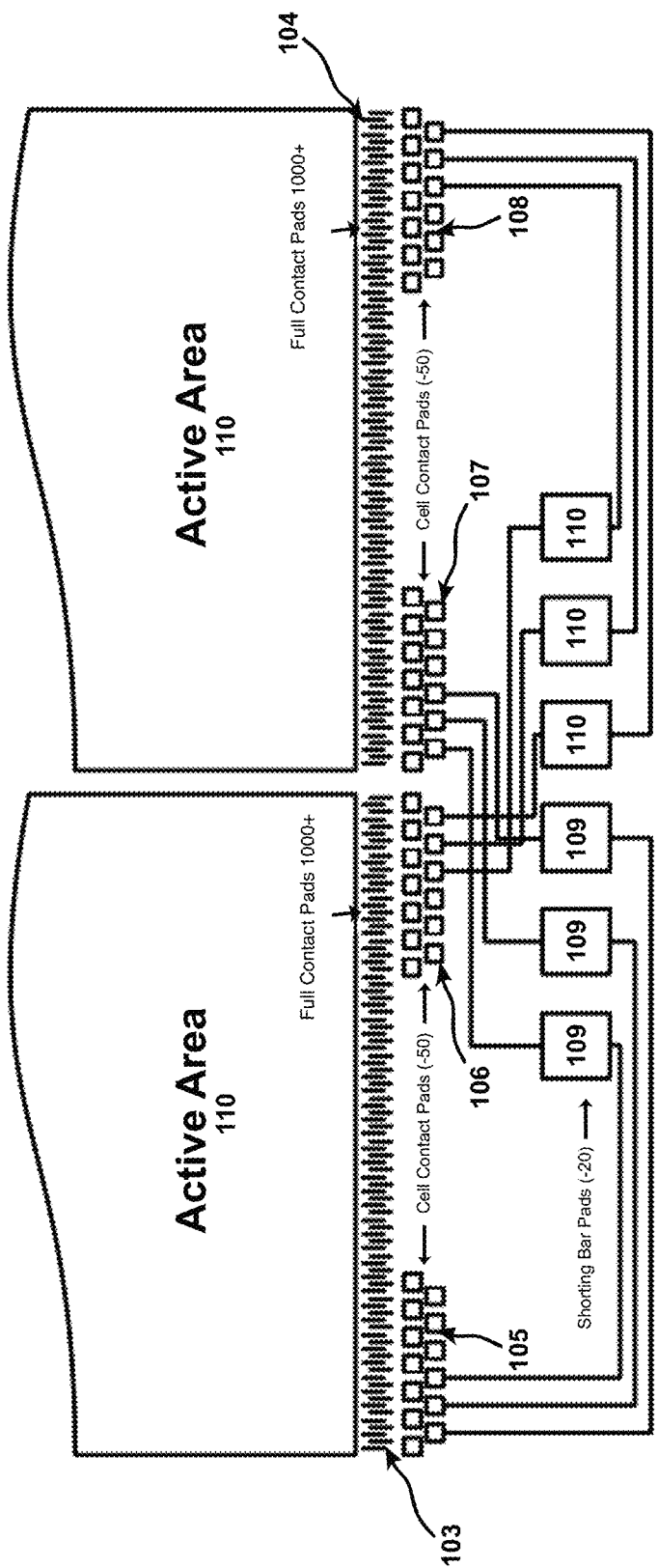
FIG. 1 illustrates an exemplary schematic representation of various probing pads relative to the panel active areas.

The described system and method rely on driving the panels under inspection by probing the pads originally intended for cell inspection, which requires no additional panel real estate. FIG. 1 illustrates an exemplary schematic representation of various probing pads relative to the panel active areas 101 and 102. As shown in FIG. 1, each panel active area 101 or 102 has an associated set of full contact pads 103 or 104, respectively, which are electrically connected to the respective panel. The number of the full contact pads can exceed 1000's of pads for a typical panel under test. In addition to the full contact pads 103 or 104, each panel 101 and 102 has an associated one or more sets of cell contact pads 105, 106, 107 and 108, whose number is about 50-60 per panel. In addition, there are shorting bars 109 and 110, which are used by the conventional inspection systems.

As would be appreciated by persons of ordinary skill in the art, using cell inspection probe pads 105, 106, 107 and 108 instead of the full contact pads 103 and 104 requires far fewer contacts (~50 pads vs. 1000+, for cell pad probing and full contact probing, respectively). The fewer number of pads to contact improves reliability and allows the use of multiple probe assemblies. In one embodiment of the inspection apparatus, the probing hardware is kept out of the path of motion of the inspection heads (esp. in the case of VIOS inspection), which further improves the throughput. In another embodiment, moving of the probing hardware or hopping over the probing hardware is performed. Nevertheless, "cell probing" is challenging due to the small size of the pads (200 um×200 um vs. 1.5 mm×1.5 mm for shorting bar probe pads), their relatively narrow pitch and their small separation from the active area of the panel under test (<3 mm vs. >10 mm for shorting bars).

Figure 2:
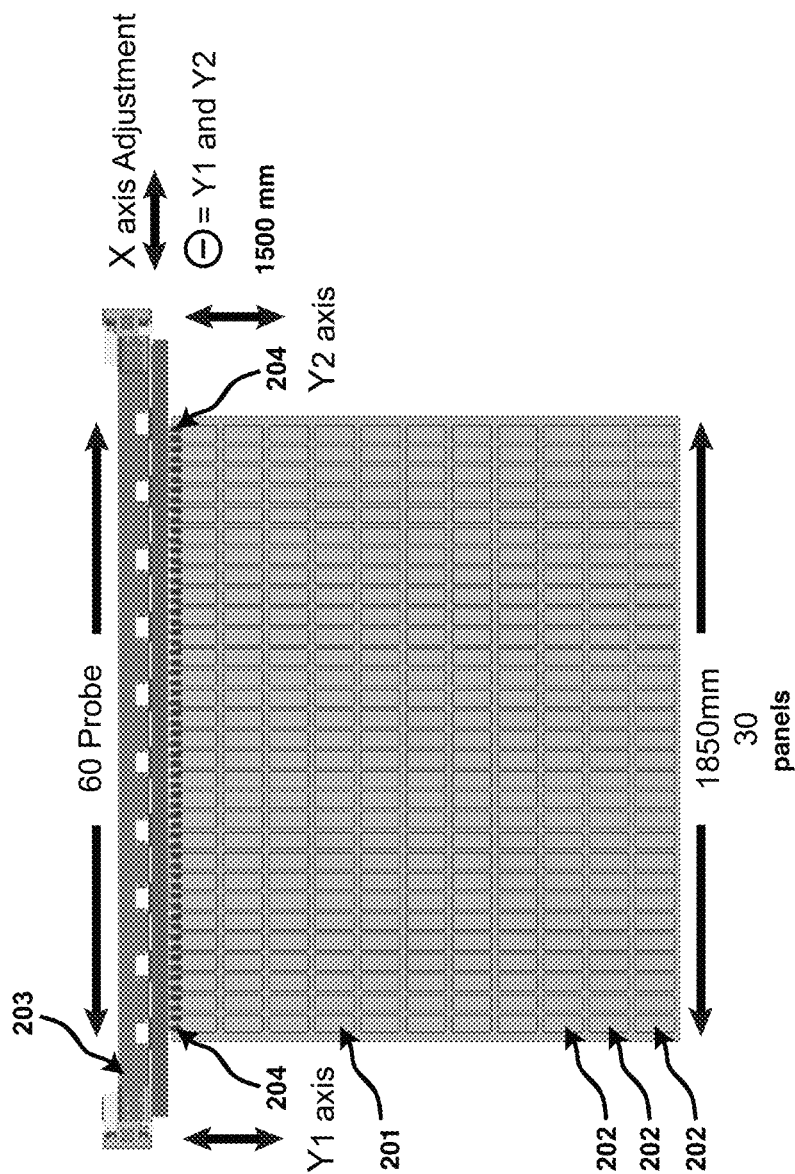
FIG. 2 illustrates a top view of the cell contact pad probe bar positioned at the first panel row of a piece of glass having dimensions 1850 mm×1500 mm.

In one or more embodiments, the described testing technique relies on probing each panel in a row of panels (i.e., the X-direction) simultaneously using multiple probe assemblies mounted on a gantry bar (the probe bar). FIG. 2 illustrates a top view of the cell contact pad probe bar 203 positioned at the first panel row of a piece of glass having dimensions 1850 mm×1500 mm. The length of the probe bar 203 is parallel to the X-direction. As shown in FIG. 2, a glass substrate 201 carries multiple rows 202 of 30 panels each. The panels in each row 202 are arranged in X-direction. As shown in FIG. 1, each panel includes two sets of cell contact pads. Thus, to simultaneously test all panels in the row 202, the probe bar 203 is used, which includes 60 probe blocks 204 (two for each panel in a row). Once Voltage Imaging or secondary electron imaging of the panel row 202 is complete, the next panel row 202 is probed for inspection. Moving to the next panel row 202 can be accomplished by moving the probe bar 203 relative to the stationary glass substrate 201, or by moving the glass 201 relative to a stationary probe bar 203. The moving portion depends on the specific architecture of the system.

In one or more embodiments, there are as many probe assemblies on the probe bar 203, as there are panels on a row 202, the current maximum being 30, implying that no motion of probe assemblies is necessary during the inspection of a row 202 of panels. Small panels are generally only probed from cell pads located on one side of the panel, but dual side probing is possible using two probe bars. In one or more embodiments, the probe assemblies consist of pins that are offset from the panel in the Y-direction to ensure that VIOS heads do not need to be lifted when moving from panel to panel.

Figure 3:
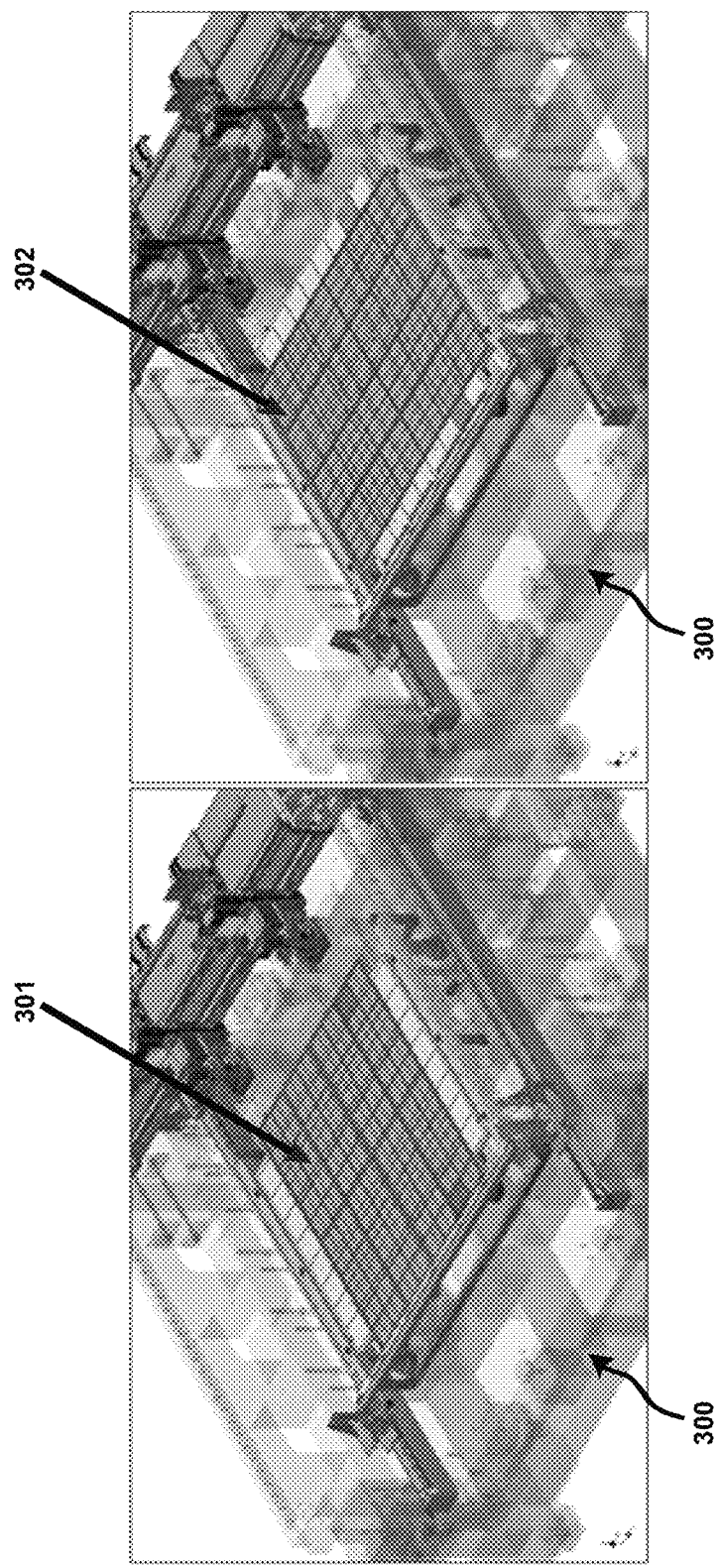
FIG. 3 illustrates a view of the chuck with internal glass rotation.
Figure 4:
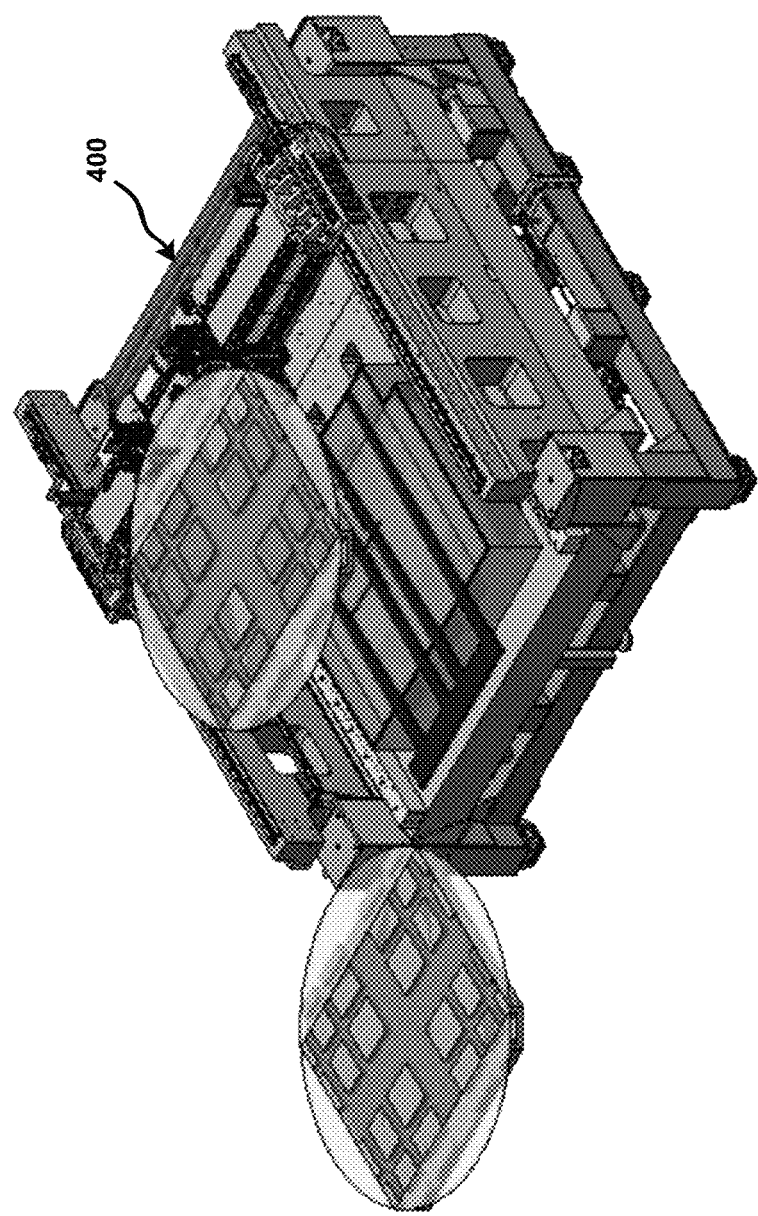
FIG. 4 illustrates a view of system showing possible locations for an external glass rotation station.

In order to accommodate panel designs in which the cell probe pads are offset from the panel in the X-direction, in one embodiment, the glass substrate 201 is rotated. In various embodiments, glass substrate rotation can occur internal or external to the system. In one embodiment, the internal rotation of the glass substrate is accomplished by a rotation axis integrated into the chuck 300, as illustrated in FIG. 3. Specifically, FIG. 3 illustrates a view of the chuck with internal glass rotation. The glass substrate is shown in both "portrait" 301, and "landscape" 302 orientations. Another, alternative, embodiment, which uses external rotation, requires a separate rotation station 400 to be provided by the Customer, as illustrated in FIG. 4. This also means that the chuck must be either square, shaped like a cross, or shaped like an "L" so that it can accommodate both portrait and landscape glass orientations 301 and 302, as shown in FIG. 3. FIG. 3 shows an exemplary cross-shaped chuck for purposes of illustration.

The capability to rotate the glass also helps the system in achieving full active area inspection very close (~3 mm) to the probe pads. The modulator in the Array Checker floats on a cushion of air. Air is supplied to the bottom of the Modulator through the air bearings. The air bearings are physically mounted to the side of the Modulator and are several millimeters thick. On previous Array Checker systems, these air bearings were parallel to the X-direction of the machine. Such an orientation on a cell contact probing machine would make active area inspection 3 mm from the probe pads impossible. Therefore, the Modulator mount has been modified to rotate the modulator 90 degrees. This positions the air bearings perpendicular to the X-direction of the system and allows for inspection of active areas much closer to the probe pads. The rotation of the Modulator is a key enabler for achieving the 3 mm active area to pad spacing specification The production lifetime for these small to mid-sized displays is generally very short, generally in the range of 3-6 months. The short lifetime is due to the relatively large number of panels that can be placed on a single piece of glass, as well as the rapid evolution of higher resolution and new models of displays. Due to the short lifetimes, Customers want a universal probing solution to cover all models, rather than a dedicated solution for each model. A universal solution improves the Customer's flexibility and lowers the running cost of the system. In order to have a truly universal solution, the Customer's will standardize their driving pads to a standard layout and number of pins to be used on all panel designs. Generally, each panel has two sets of pad groups, one justified to the left edge of the panel, and the other justified to the right edge of the panel. Because panels are different sizes, the distance between the left and right pad groups will vary by model. In order for a universal probing system to work, it must be capable to probe layouts with variable spacing between the standardized left and right pad groups. This is best accomplished by providing dedicated Probe Blocks for the left pad groups and dedicated Probe Blocks for the right pad groups.

Figure 5:
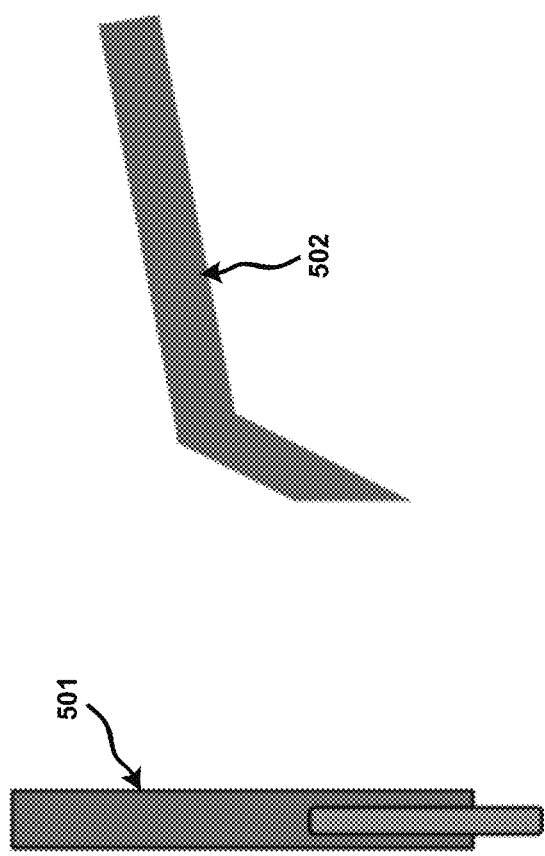
FIG. 5 illustrates exemplary embodiments of pogo pins and cantilever pins.
Figure 6:
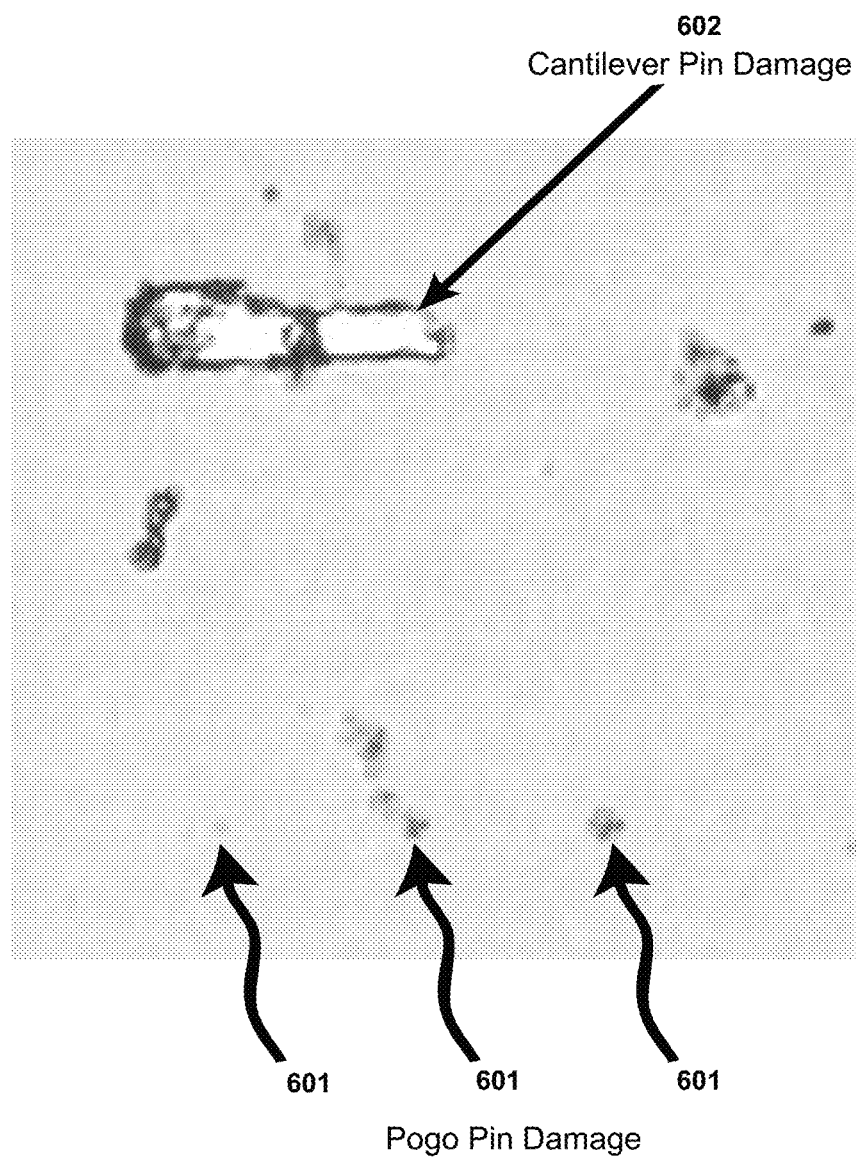
FIG. 6 illustrates exemplary pad damage caused by cantilever and pogo style pins.

In one or more embodiments, the described testing system utilizes spring-loaded pogo-style pins to make contact with the pads. An exemplary embodiment 501 of such pins is illustrated in FIG. 5. In one embodiment, the pogo-style pins 501 can be spring-loaded in the vertical direction so ensure a good mechanical and electrical contact with the cell contact pad. Another embodiment of the system uses cantilever style pins also shown in FIG. 5, element 502 for probing these types of small pads. Cantilever pins 502 can be manufactured to very small diameters, making them suitable for probing very small pads. Their drawback is that they can result in excessive damage to the probe pads. During compression, the cantilever pins dig into the pads causing damage. Such damage to the contact pad generates particles, which, if not managed properly, may cause electrical shorts or other damage of the electronic devices of the panel(s). By comparison, pogo pins do not cause nearly the same level of damage to the contact pad. FIG. 6 illustrates typical damage to the contacts pads caused by the pogo-style pins 501 (601) and cantilever pins 502 (602). As can be seen from the FIG. 6, damage 601 from pogo pins is substantially less extensive than damage 602 caused by the cantilever pins 502.

As would be appreciated by persons of ordinary skill in the art, minimizing pad damage results in fewer particles generated on the glass and helps to minimize particle defects in the display. Limiting the number of particles generated during inspection helps to enable intermediate electrical inspection of panels during the array manufacturing process. Today the vast majority of electrical inspection is done only after the panel has completed array manufacturing. For panels using Low-Temperature Polysilicon (LTPS—most high resolution mobile displays use LTPS) thin film transistors (TFTs), it is possible, however, to do intermediate electrical inspection during the array manufacturing process, specifically after deposition of M2 and patterning of the source-drain (S/D) layer. Many customers do not do S/D layer inspection due to large particle generation from their current probing solutions. By providing electrical test capability with minimal probe pad damage, the electrical S/D layer testing may become feasible. This provides yet another opportunity for customers to improve their yield.

In one or more embodiments, as stated above, the cell contact pads 105, 106, 107 and 108 of the panels on the glass are simultaneously engaged using multiple probe blocks 204 arranged on a probe bar 203. To achieve a proper electrical contact, the probe pins of the probe blocks 204 must be aligned with the aforesaid respective cell contact pads. To this end, in one or more embodiments, the lateral (X) positions of the probe blocks 204 on the probe bar 203 can be adjusted (manually or in semi-automated fashion) to match the layout of the cell contact pads 105, 106, 107 and 108 on the glass under inspection. In various embodiments, the probe blocks 204 may be also be added or removed such that the number of probe blocks 204 along the length of the bar 203 matches the glass layout.

In one or more embodiments, the operator configures the probe bars 203 manually. In this embodiment, an efficient model change is achieved by using multiple sets of probe bars 203 that are configured for different glass layout. In this embodiment, one probe bar 203 is in active use on the inspection system, while a second probe bar 203 is being manually configured offline. When the customer needs to begin testing a different glass layout on the inspection system, the aforesaid probe bars 203 are switched.

Figure 7:
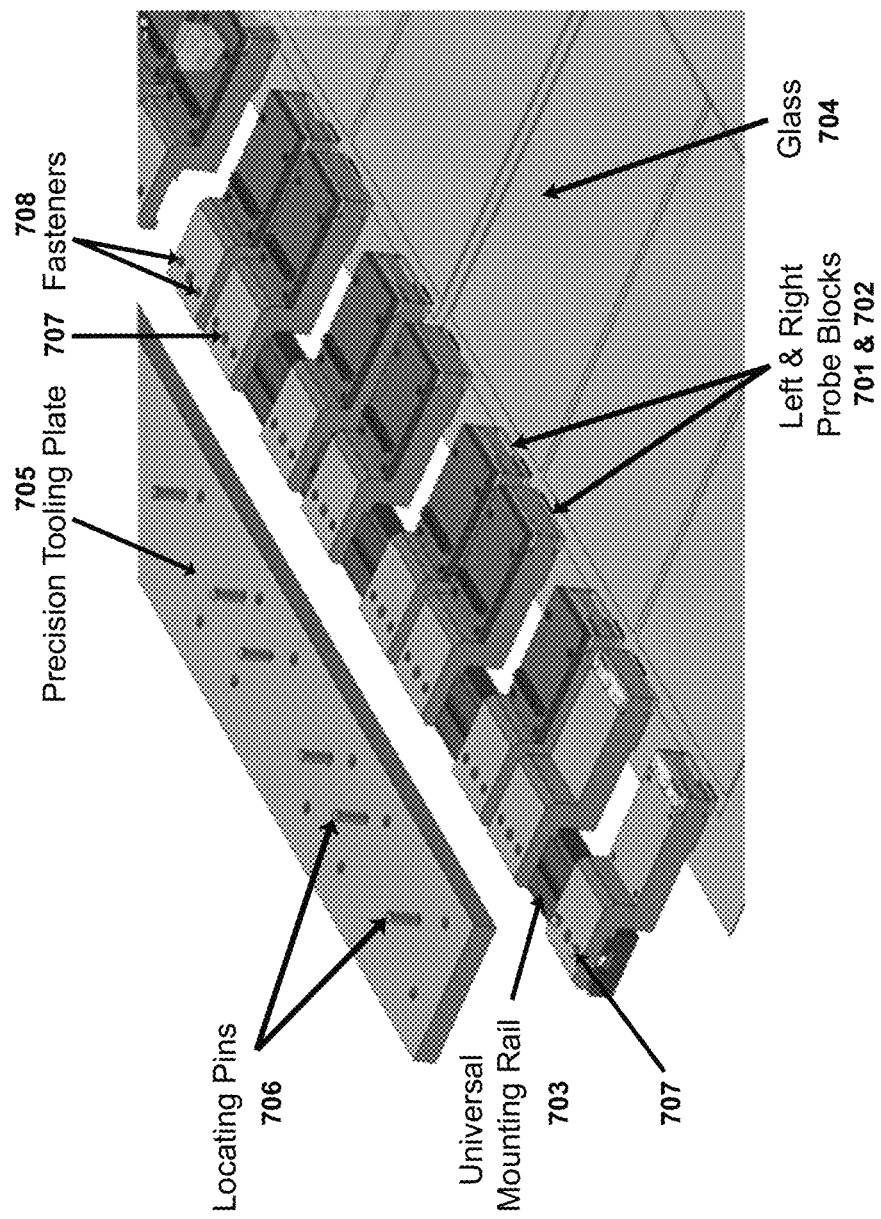
FIG. 7 illustrates a manually configurable cell contact pad probe bar.

FIG. 7 illustrates an exemplary embodiment of a manually configurable probe bar 203. This embodiment uses two types of probe blocks: left probe blocks 701 and right probe blocks 702, which are positioned anywhere along the length of a universal mounting rail 703 in order to match up with the pad locations on the specific model of glass under test 704. The probe blocks 701 and 702 are attached to the universal mounting rail 703 using fasteners 708. In one embodiment, accurate positioning of the probe blocks 701 and 702 along the universal mounting rail 703 is achieved using a precision tooling plate 705. In one embodiment, the precision tooling plate 705 contains multiple locating pins 706 that are used to position the probe blocks 701 and 702 in the correct locations along the bar 203. To this end, the locating pins 706 are designed to mechanically mate with precision alignment holes 707 in the probe blocks 701 and 702. In one embodiment, the positions of the locating pins 706 are machined into the precision tooling plate 705 at locations that correspond to specific glass layouts. In various embodiments, the precision tooling plate 705 may be manufactured to support one or more specific glass layouts.

In one or more embodiments, the sequence of steps necessary for the probe bar 203 configuration is as follows. First, the probe bar 203 is placed onto a workbench 801, see, for example, FIG. 8. Second, the fasteners 708 (see FIG. 7) on each probe block 701 and 702 are loosened. Third, the precision tooling plate 705 with locating pins 706 is positioned the over probe bar 203. Fourth, the probe blocks 701 and 702 are slid into their respective positions until the locating pins 706 are aligned with the precision alignment holes 707 in the probe blocks 701 and 702. Fifth, the locating pins 706 of the precision tooling plate 705 are engaged into the precision alignment holes 707 of the probe blocks 701 and 702. Finally, sixth, the fasteners 708 (see FIG. 7) on each probe block 701 and 702 are tightened to lock the probe blocks into their respective places along the universal mounting rail 703.

Figure 8:
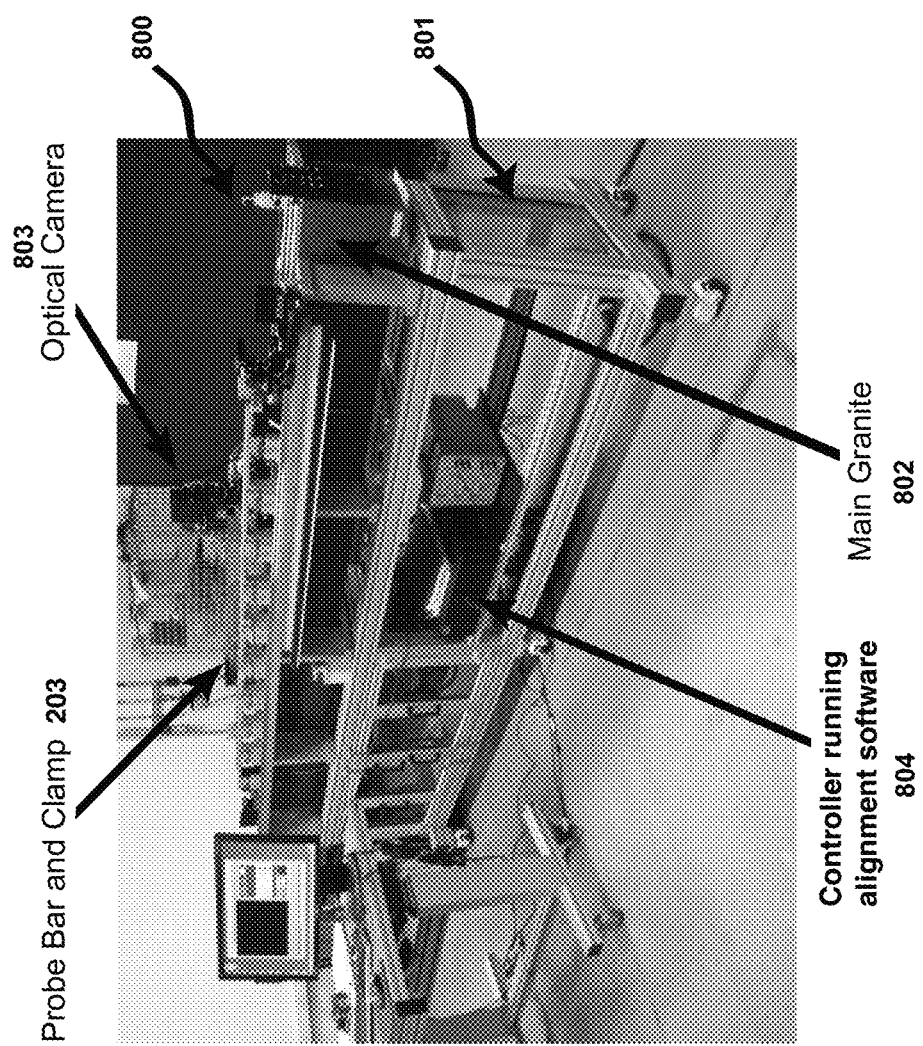
FIGS. 8 and 9 illustrate an exemplary embodiment of a semi-automated and automated probe bar reconfiguration station.
Figure 9:
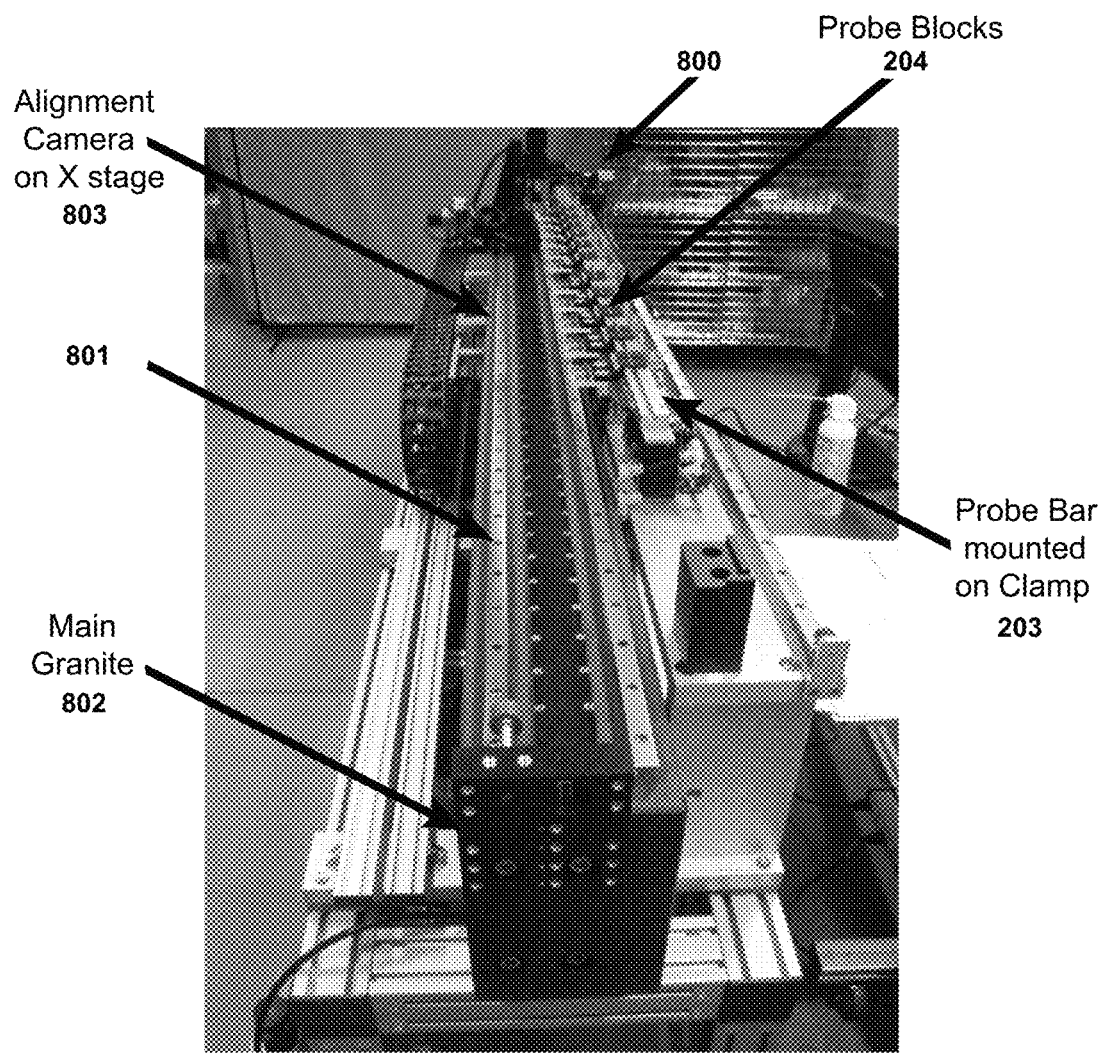

In another, alternative, embodiment, the probe bar 203 is configured semi-automatically. The semi-automated probe bar 203 configuration may be accomplished in several different ways. One embodiment of the semi-automated probe bar 203 configuration is implemented using a dedicated probe bar reconfiguration station 800 shown in FIGS. 8 and 9. In one embodiment, the reconfiguration station 800 incorporates tooling for precise alignment of each of the probe blocks 204 to the respective precise locations. In one embodiment, the reconfiguration station 800 includes a highly accurate X axis rail 801 mounted on precision granite 802, an optical alignment camera 803 along with precision alignment holes 707 on each probe head to position each probe block 204 independently and precisely along the length of the probe bar 203. The respective components of the probe bar reconfiguration station are illustrated in FIGS. 8 and 9. The semi-automated reconfiguration is controlled by alignment software executed by a controller 804.

In another, alternative, embodiment, the probe bar 203 is configured fully automatically using a pick-and-place robot, similar to the probe configuration stations (PCS) described in U.S. Pat. No. 9,103,876, incorporated by reference herein. Such an embodiment requires no assistance from an operator to perform the reconfiguration.

In one or more embodiments, electrical connections carrying the signals generated by the pattern generator subsystem are run to each probe block 204. In one embodiment, the pattern generator subsystem is located in the electronics cabinet (E-Cabinet) of the inspection system. Signals are carried from the pattern generator subsystem through cables to the probe assembly controller (PAC) boards mounted to the outside of the stage. In one embodiment, each PAC board contains a switching array, allowing the correct signal exiting the pattern generator subsystem to be routed to the correct pin on a specific probe block 204. Because there can be a varying number of probe blocks 204 mounted to the probe bar 203 at any time, an electrical bus for carrying the pattern generator subsystem signals is run along the length of the probe bar 203. In various embodiments, this electrical bus can be cable or PCB based. Each probe block 204 is then individually connected or disconnected from the aforesaid electrical bus. The aforesaid electrical bus can range from a universal design, serving all glass layouts, or be dedicated to individual or only a few layouts. A non-universal electrical bus would require the operator to change the bus for some layouts. This exchange process takes place at the same time as the probe bar 203 is exchanged.

In one or more embodiments, the first time the probe bar 203 is placed on the system and electrical connections made, the operator must "teach" the glass. Glass teaching requires the operator to execute a series of defined steps in order to calibrate the location of the glass plate, and all panels within the plate, relative to the system. Due to the smaller pad sizes associated with cell contact pad probing, accurate teaching and probe bar placement are much more critical. After installing the probe bar 203 on the system, the operator executes an automated optical inspection of the probe bar. During this process, a review camera is positioned over the probe blocks 204 and moved along the length of the probe bar 203. The review camera moves to defined positions along the probe bar 203, corresponding to the expected location of each probe block 204. When the expected probe block 204 position is reached, an image of a probe block 204 alignment feature is taken using the alignment camera contained within the system. The system software calculates the difference between the measured and expected location of this mark. If the delta for each probe block 204 is acceptable, the probe bar 203 can be used on the system. If any of the deltas are unacceptable, the probe bar 203 must be removed and the locations corrected with either the universal tooling plate 705 shown in FIG. 7, or the probe bar reconfiguration station 800 shown in FIGS. 8 and 9.

In one or more embodiments, once the configuration of the probe bar 203 is verified, the operator needs to teach the pad positions and verify that the pins on each probe block 204 make electrical contact with the corresponding cell contact pads on the glass substrate under inspection. This is also aided by an optical system in which the operator can visualize the pads on the glass and contact with the probe pins at the same time. The operator needs to check this pin to pad contact at each panel row. Because there can be some variation of panel placement from glass to glass, in one embodiment, the probe bar contains a small motor to enable a global X-direction compensation. If needed, the operator is enabled to use the aforesaid motor to shift the entire probe bar 203 by about 1 mm in both directions along the X-axis of the plate to achieve a proper pin-to-contact pad alignment. In various embodiments, such a global adjustment can be taught for each panel row.

In one embodiment, during the plate inspection, the software automatically controls the probe bar X-axis motor to adjust the X-position of the probe bar to the taught position to insure repeatable positioning and contact of the probe bar pins. It should be also noted that that the global repositioning of the probe bar 203 is also achieved by the probe bar Y gantry stages, which are used to adjust the Y-position and angle of the probe bar 203.

In one or more embodiments, as can be done for shorting bar probing, cell contact pad probing can also support different types of electrical contact tests with the panels under test prior to electrical inspection. Contact test can be achieved with force and sense pin pairs on each pad, assuming the pad size supports this. Typically, the pad area must be doubled to support force/sense pin pairs. Cell contact pad probing can also support multi-force/common sense contact test. In this scenario, signals are applied to each force pin in succession and read back from the common sense pin connected to the panel. By using a common sense line approach, the number of pins in the probe block 204 is reduced and smaller contact pads and/or smaller number of pads can be used.

Figure 10:
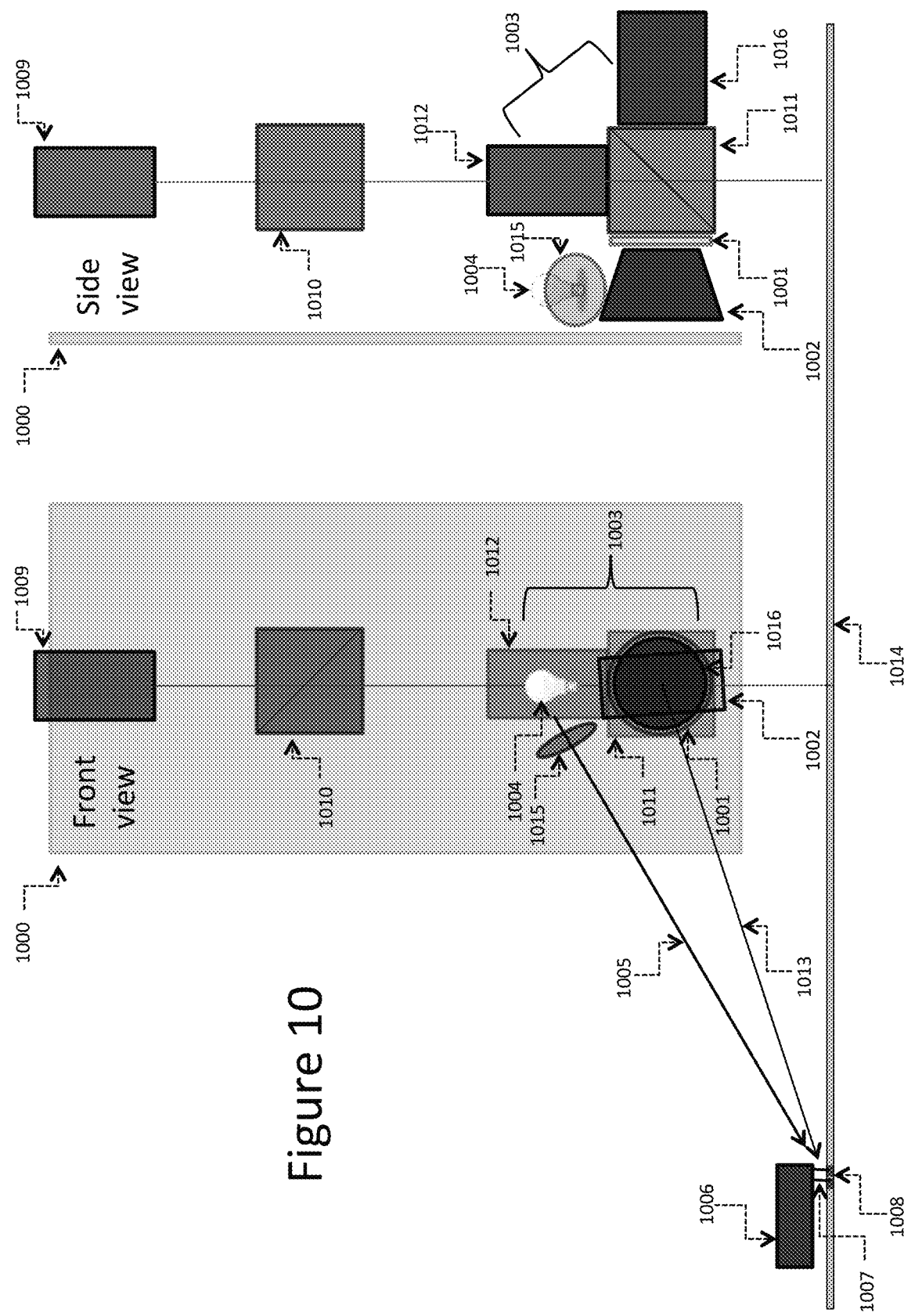
FIG. 10 illustrates an exemplary embodiment of a pin inspection camera system for visualization of the probe pin contact alignment.

FIG. 10 illustrates an exemplary embodiment of a pin inspection camera system (1000) for visualization of the probe-pin contact alignment. The pin inspection camera is partially incorporated into the optics [camera (1009), beam splitters 1010 and 1011, AOS lens (1012)] of an alignment optical system (AOS), traditionally used to align the display panel under test (1014). The imaging path of the pin inspection camera begins at the imaging sensor (1009) and passes through a beam splitter (1010), the AOS lens (1012) and reflects at 90 degrees from a second beam splitter (1011). The imaging path then passes through a negative lens (1001) [used to expand the field of view so that all pins (1007) on a probe block (1006) can be imaged] and is then reflected by a mirror (1002) to the side and down (1013) towards pins (1007) in a pin block (1006). The imaging path of the AOS follows the same path to beam splitter 1011 but is transmitted downward to the display panel under test (1014). The illumination path begins at a LED (1004) and is directed down (1005) through a concentrating lens (1015) towards the pin block (1006) and pins (1007). In another embodiment of the illumination path, the AOS illumination (1016) is used, with the light transmitted through beam splitter (1011) and reflected by a mirror (1002) downward (1013). Note that for the pin inspection camera imaging and one illumination path (1013), and the other illumination path (1005), the angles are sufficiently shallow that imaging and illumination are allowed to take place underneath the probe block (1006) and visualization of the probe pins (1007) to display-panel-pad (1008) contact points is possible.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive.

Moreover, other implementations of the invention will be apparent to those skilled in the art from consideration of the specification and practice of the invention disclosed herein. Various aspects and/or components of the described embodiments may be used singly or in any combination in the system for testing of electronic devices. It is intended that the specification and examples be considered as exemplary only, with a true scope and spirit of the invention being indicated by the following claims.

What is claimed is:

1. A probe system for facilitating inspection of a device under test comprising a plurality of panels, the probe system comprising:
    a. a configurable probe bar comprising a plurality of probe blocks, the plurality of probe blocks comprising a plurality of probe pins positioned to simultaneously electrically engage a plurality of cell contact pads of the plurality of panels of the device under test to deliver a plurality of electrical test signals; and
    b. an alignment system configured to position each probe block of the plurality of probe blocks independently and precisely along the length of the configurable probe bar such that the plurality of probe pins are aligned with the plurality of the cell contact pads of the plurality of panels of the device under test, wherein the probe bar is configured using a precision tooling plate comprising a plurality of locating pins, wherein the plurality of locating pins engage alignment holes in the plurality of probe blocks.

2. The probe system of claim 1, wherein the probe bar further comprises a universal mounting rail and wherein the plurality of probe blocks are mounted in predetermined positions on the universal mounting rail.

3. The probe system of claim 2, wherein the plurality of probe blocks are mounted on the universal mounting rail using a plurality of fasteners.

4. The probe system of claim 1, wherein the plurality of probe pins are pogo pins.

5. The probe system of claim 1, wherein the plurality of probe pins are spring-loaded.

6. The probe system of claim 1, wherein the alignment system further comprises a motor for adjusting a lateral (X) direction position of the probe bar.

7. The probe system of claim 1, wherein the alignment system further comprises a rotation system for rotating the device under test.

8. The probe system of claim 1, wherein the alignment system further comprises a rotation system for rotating the probe bar.

9. The probe system of claim 1, wherein locations of the plurality of locating pins of the precision tooling plate correspond to a layout of the cell contact pads of the device under test.

10. The probe system of claim 1, wherein the probe bar is configured manually by loosening fasteners of the plurality of probe blocks, repositioning the plurality of probe blocks such that the plurality of locating pins engage alignment holes in the plurality of probe blocks and tightening the fasteners of the plurality of probe blocks.

11. The probe system of claim 1, wherein the alignment system further comprises an alignment camera configured to detect positions of the probe blocks of the probe bar and wherein the probe bar is configured automatically based on the detected positions of the probe blocks.

12. The probe system of claim 11, wherein the alignment system further comprises a robot for automated repositioning the probe blocks of the probe bar based on the detected positions of the probe blocks.

13. The probe system of claim 1, wherein the alignment system further comprises a probe bar reconfiguration station for semi-automatically configuring the probe bar by adjusting positions of the plurality of probe blocks on the probe bar to match a layout of the plurality of cell contact pads.

14. The probe system of claim 1, wherein probe bar comprises an electrical bus for carrying the plurality of electrical test signals from a pattern generator to the plurality of probe pins of the probe blocks of the probe bar.

15. The probe system of claim 14, wherein the electrical bus runs the entire length of the probe bar.

16. The probe system of claim 1, wherein the plurality of panels are arranged on the device under test into a plurality of panel rows and wherein the probe pins of the probe bar are configured to engage cell contact pads of an entire row of panels of the device under test.

17. The probe system of claim 1, wherein the device under test is a glass substrate and wherein the plurality of panels are display panels.

18. The probe system of claim 1, further comprising a pin viewer camera for acquiring real time images or real time video of at least some of the plurality of probe pins in contact with at least some of the plurality of the cell contact pads and for providing the acquired images or video for viewing by an operator of the probe system.

19. A method for facilitating inspection of a device under test comprising a plurality of panels, the method comprising:
    a. configuring a universal probe bar by positioning a plurality of probe blocks at predetermined locations along a universal mounting rail, the plurality of probe blocks comprising a plurality of probe pins, wherein the plurality of probe blocks are positioned to have the plurality of probe pins simultaneously electrically engage a plurality of cell contact pads of the plurality of panels of the device under test to deliver a plurality of electrical test signals; and
    b. using an alignment system to position each probe block of the plurality of probe blocks independently and precisely along the length of the configurable probe bar such that an alignment of the plurality of probe pins with the plurality of the cell contact pads of the plurality of panels of the device under test is achieved, wherein the universal probe bar is configured using a precision tooling plate comprising a plurality of locating pins, wherein the plurality of locating pins engage alignment holes in the plurality of probe blocks.

20. The method of claim 19, wherein the universal probe bar is configured manually by loosening fasteners of the plurality of probe blocks, repositioning the plurality of probe blocks such that the plurality of locating pins engage alignment holes in the plurality of probe blocks and tightening the fasteners of the plurality of probe blocks.

21. A system for inspection of a device under test comprising a plurality of panels, the system comprising:
    a. a configurable probe bar comprising a plurality of probe blocks, the plurality of probe blocks comprising a plurality of probe pins positioned to simultaneously electrically engage a plurality of cell contact pads of the plurality of panels of the device under test to deliver a plurality of electrical test signals;
    b. an alignment system configured to position each probe block of the plurality of probe blocks independently and precisely along the length of the configurable probe bar such that the plurality of probe pins are aligned with the plurality of the cell contact pads of the plurality of panels of the device under test;

c. a test pattern generator for generating test signals, the test signals being applied, through the plurality of probe pins, to the plurality of cell contact pads of the plurality of panels of the device under test; and d. an inspection system for performing inspection of the plurality of panels of the device under test in response to the applied test signals, wherein the configurable probe bar is configured using a precision tooling plate comprising a plurality of locating pins, wherein the plurality of locating pins engage alignment holes in the plurality of probe blocks.

22. The system of claim 21, wherein the inspection system is a voltage imaging optical system.

* * * * *